United States Patent [19]

Tong

[11] Patent Number: 4,843,607
[45] Date of Patent: Jun. 27, 1989

[54] MULTIPLE ERROR TRAPPING
[75] Inventor: Po Tong, Alameda, Calif.
[73] Assignee: Cyclotomics, Inc., Berkeley, Calif.
[21] Appl. No.: 134,137
[22] Filed: Dec. 17, 1987
[51] Int. Cl.$^4$ ............................................. G06F 11/10
[52] U.S. Cl. ..................................................... 371/37
[58] Field of Search ........................ 371/37, 38, 39, 40
[56] References Cited

U.S. PATENT DOCUMENTS 4,414,667 11/1983 Bennett .............................. 371/39 X
4,566,105 1/1986 Oisel ...................................... 371/37
4,584,686 4/1986 Fritze ..................................... 371/37

Primary Examiner—Jerry Smith
Assistant Examiner—Robert W. Beausoliel
Attorney, Agent, or Firm—Robert M. Wallace

[57] ABSTRACT

By translating in accordance with a predetermined permutation the virtual check locations of a virtual message re-encoder, plural erroneous symbols (up to a certain limit) occurring in any pattern in a received codeword may be trapped simultaneously in virtual check locations. By simply adding to them the corresponding virtual check symbols computed by the virtual message re-encoder, the correct codeword is easily obtained. In one embodiment of the invention, any pattern of two erroneous symbols in a codeword of length n may be trapped in this manner by defining the predetermined permutation in accordance with a modulus n cyclic difference set. In this embodiment, for an RS(31, 25) code, the cyclic difference set (0, 4, 10, 23, 24, 26) may be used as the predetermined permutation.

16 Claims, 6 Drawing Sheets

FIG. 4

ORIGINAL CHECK LOCATIONS:    $\alpha^0$   $\alpha^1$   $\alpha^2$   $\alpha^3$   $\alpha^4$   $\alpha^5$

SHIFTED VIRTUAL CHECK LOCATIONS:

$$\begin{array}{c} \alpha^0 \\ \alpha^1 \\ \alpha^3 \\ \alpha^8 \\ \alpha^{12} \\ \alpha^{18} \end{array} \left( \begin{array}{cccccc} \alpha^0 & 0 & \alpha^{25} & \alpha^{15} & \alpha^8 \\ 0 & \alpha^0 & \alpha^4 & \alpha^{19} & \alpha^{23} \\ 0 & 0 & \alpha^{15} & \alpha^0 & \alpha^9 & \alpha^7 \\ 0 & 0 & 0 & \alpha^{14} & \alpha^{24} & \alpha^{20} \\ 0 & 0 & 0 & \alpha^{27} & \alpha^4 & \alpha^{17} \\ 0 & 0 & 0 & \alpha^0 & \alpha^{20} & \alpha^3 \end{array} \right\} \text{TRANSLATE MATRIX}$$

WHERE:

$\alpha$ IS A ROOT OF $x^5 + x^2 + 1 = 0$, AND GENERATOR POLYNOMIAL $G(x) = (x-\alpha^0)(x-\alpha^1)(x-\alpha^2)(x-\alpha^3)(x-\alpha^4)(x-\alpha^5)$ FOR RS(31,25) CODE

FIG. 7

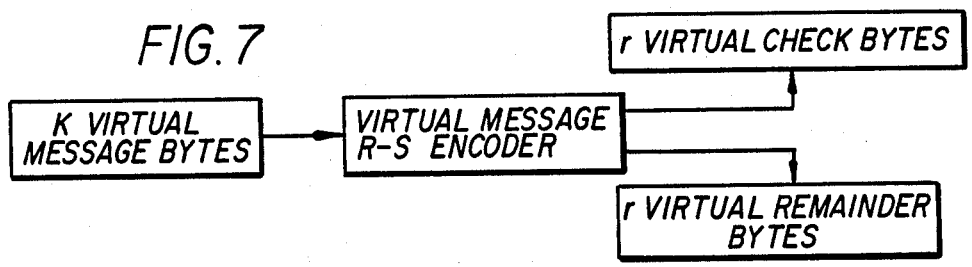

DEFINITIONS:

$y_i$ = RECEIVED VIRTUAL MESSAGE BYTE AT VIRTUAL MESSAGE LOCATION $\alpha^i$ $f(\alpha^k)$ = COMPUTED VIRTUAL CHECK BYTE AT VIRTUAL CHECK LOCATION $\alpha^k$ $F_c(z)$ = VIRTUAL CHECK POLYNOMIAL = $\prod (z - \alpha^i)$
  $i \in$ VIRTUAL CHECK LOCATIONS $F_m(z)$ = VIRTUAL MESSAGE POLYNOMIAL = $\prod (z - \alpha^i)$
  $i \in$ VIRTUAL MESSAGE LOCATIONS $F_c'(\alpha^k) = \frac{d}{dz} F_c(z) \Big|_{z = \alpha^k}$ $F_m'(\alpha^i) = \frac{d}{dz} F_m(z) \Big|_{z = \alpha^i}$

COMPUTATIONS:

VIRTUL CHECK SYMBOL COMPUTATION:

$$f(\alpha^k) = \frac{1}{F_c'(\alpha^k)} \sum_{i \in \text{VIRTUAL MESSAGE LOCATIONS}} \frac{y_i}{(\alpha^i - \alpha^k) F_m'(\alpha^i)}$$

MULTIPLE ERROR TRAPPING

BACKGROUND OF THE INVENTION

Error trapping is a well-known shortcut in the art of error detection and correction. It is described, for example, in Peterson and Weldon, *Error-Correcting Code*, The MIT Press, 1984, at pages 237–240 and 364–367. Whenever applicable, error trapping obviates the need for the decoder to execute a highly sophisticated error correction algorithm, such as the Berlekamp key equation solver algorithm, as described in Berlekamp, *Algebraic Coding Theory*, McGraw-Hill, 1968, page 184, or the Welch-Berlekamp algorithm, which is the subject of U.S. Pat. No. 4,663,470 by Berlekamp and Welch, or the Euclidian algorithm. Avoiding the execution of such algorithms represents a significant savings in time and overhead.

The idea behind error trapping is this. Whenever a received codeword is such that all of its message symbols are correct and errors only appear in a few of the check symbols, shifting the entire received codeword through an encoder produces a set of new check symbols (or, more accurately, remainder symbols) which are all zero except those corresponding to received codeword check symbols having errors. (the term "new check symbols" as used herein is really a misnomer, since the symbols thus generated are actually "remainder" symbols defining the remainder left after dividing the entire received codeword by the code generator polynomial. The term "check symbol" usually connotes the remainder left after dividing only the message portion of the codeword by the code generator polynomial.) The new check symbols are precisely equal to the error pattern. Thus, error correction is trivially achieved by simply adding the non-zero new check symbols to the corresponding locations in the received codeword.

In order to trap errors occurring in the message portion of the received codeword, the encoder (typically a shift register having a number of feedback stages precisely equal to the number of check symbols in each codeword) is simply shifted until its contents are all zero except for a non-zero symbol pattern of no more than half ($r/2$) the total number ($r$) of check symbols. This non-zero symbol pattern is, by definition, the error pattern occurring in the corresponding shifted codeword locations. If the erroneous symbol occurs in the check portion of the received codeword, no shifting of the encoder register is necessary. If an error occurs in the last message symbol adjacent the check symbols, the encoder need be shifted only once. If the error occurs in the very first message location in the codeword, then the encoder must be shifted a number of times equal to the number of message symbols in the codeword in order to trap the error.

Problem to be Solved by the Invention

The obvious limitation of error trapping is that only single error correction is guaranteed. Since all plural errors must be "trapped" in the re-encoder simultaneously, the plural error pattern cannot exceed the length of the encoder shift register (this length is the number $r$ of check symbols in the codeword). Unfortunately, it cannot be guaranteed that all patterns of plural errors will not exceed this length. Therefore, error trapping guarantees correction of only single errors. The problem is how to guarantee trapping of more than one error and, particularly, how to trap more than one error in a pattern in which the distance between erroneous symbols in the received codeword exceeds the length ($r$) of the shift register/encoder.

SUMMARY OF THE INVENTION

Multiple errors of any pattern are trapped by repeatedly permuting the virtual check locations of a virtual message re-encoder (in accordance with a pattern in which the permuted check locations are not contiguous) until all of the errors in the received codeword (up to some limited number) are trapped simultaneously in a permuted set of virtual check locations. In order to trap any pattern of two errors (i.e., two symbols of the received codeword contain errors), the virtual check locations are permuted in accordance with a mathematical object known as the cyclic difference set.

Solution to the Problem

By permuting the set of virtual check locations of a virtual message encoder so as to cover all possible patterns of a limited number of errors, any given pattern of erroneous symbols (up to a limited number) in the received codeword will eventually be trapped simultaneously in one of the permutations of the virtual check locations. As soon as this occurs, all of the virtual check symbols generated by the virtual message encoder are zero except for those symbols (or symbol) coinciding with the error locations in the received codeword. Correction is trivially obtained at this point by simply adding the non-zero virtual check symbols to the corresponding virtual check locations in the received codeword. The result is a corrected codeword.

Preferred Embodiment

In one embodiment of the invention, the check symbols generated in a conventional Reed-Solomon re-encoder are transformed by a matrix implementing a given permutation of the check symbol locations to produce a corresponding set of virtual check symbols. The contents of the re-encoder are recirculated until the transformed virtual check symbols comprise all zeroes except for a limited number of non-zero virtual check symbols. These, of course, are the errors to be added back into the corresponding locations in the received codeword to obtain correction. In the preferred embodiment of the invention, the transform matrix is an implementation of the cyclic difference set, and the decoder can trap all patterns of two erroneous symbols in the codeword.

Alternative Embodiment

In one alternative embodiment of the invention, the received codeword is stored in a recirculating shift register. Each time the register is shifted, its content is transmitted to a virtual message encoder whose virtual check locations are defined in accordance with the desired permutation of the check locations. As one example, this permutation is defined in accordance with the cyclic difference set. The contents of the recirculating shift register are repeatedly shifted until the virtual message encoder generates a set of virtual check symbols comprising all zeroes except for a limited number of non-zero virtual check symbols. As in the preferred embodiment, this condition signals that all the errors have been trapped and that the non-zero check symbols are the errors to be added back into the corresponding virtual check locations in the received codeword to generate a corrected codeword. If the virtual check locations of the virtual message encoder are defined in accordance with the cyclic difference set, then as many as two erroneous symbols occurring in any pattern in the received codeword may be trapped in virtual check locations and easily corrected in the manner described.

Permutations other than that defined by the cyclic difference set may be implemented, but in any case the number of errors which can be corrected is no more than r/2.

DESCRIPTION OF THE DRAWINGS

The invention may be understood by reference to the accompanying drawings, of which:

FIG. 4 illustrates the translate matrix network in the system of FIG. 3;

FIG. 7 is a diagram defining the operation of the virtual message encoder in the system of FIG. 6.

DETAILED DESCRIPTION

Conventional Error Trapping

Figure 1:
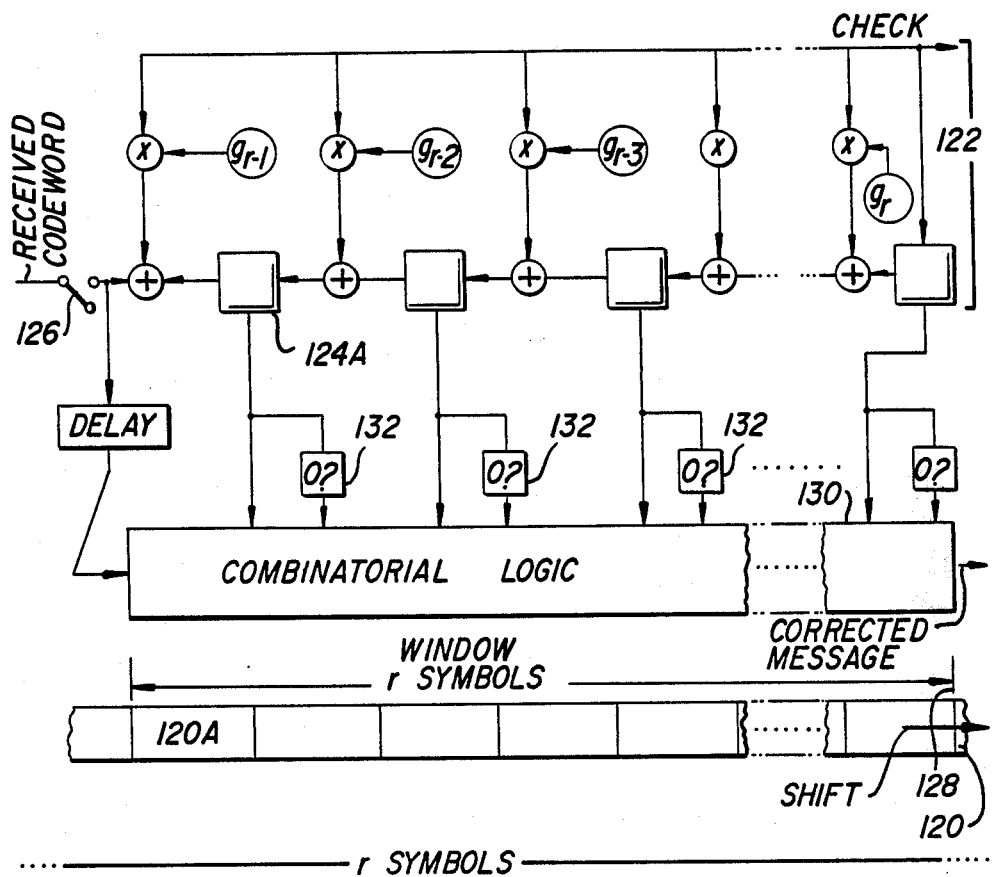
FIG. 1 is a block diagram of an error trapping decoder of the prior art.

Referring to FIG. 1, a received codeword 120 has n symbols, of which r comprise redundant check symbols computed from the remaining k symbols (which are user data) in accordance with a code generator polynomial. The received codeword 120 is shifted through the r stages of a typical Reed-Solomon re-encoder 122, which has feedback provided in the well-known manner in accordance with the coefficients $g_0, g_1, g_2, \ldots, g_{r-1}$ of the code generator polynomial. After all n symbols of the received codeword 120 have been shifted through the r stages of the re-encoder 122, the contents of each stage 124 of the re-encoder 122 contains a corresponding one of the r remainders of the received codeword 120. If there are no more than r/2 erroneous symbols in the received codeword, and if all of the erroneous symbols are within r locations of one another, then all of the errors may be corrected by conventional error trapping. In this process, a switch 126 is opened and the contents of the re-encoder are shifted right-to-left by one position. This may be thought of as a further shifting of the codeword through the encoder. With each such shift, the contents of the r stages 124 changes. Once the errors are all trapped, the stages 124 will contain all zeroes except for those locations corresponding to received errors in the codeword.

Each shift of the re-encoder 122 corresponds to a shift by one position of a window 128 of symbol length r which may be thought of as overlying the codeword 120. As soon as this window 128 overlies all the erroneous symbols simultaneously in the codeword 120, the contents of the r stages 124 will be all zeroes, except for those stages corresponding to error locations in the codeword 120.

For this purpose, combinatorial logic 130 simultaneously inspects, through r zero detectors 132, the contents of each of the stages 124 with each such shift. As soon as the zero detectors 132 indicate that all the errors have been trapped (i.e., all but no more than a limited number of the stages 124 contain all zeroes), the combinatorial logic adds all of the non-zero current contents of the stages 124 to the corresponding codeword locations bracketed by the current (shifted) position of the window 128 over the codeword 120. For example, if after several shifts of the re-encoder 122 the zero detectors 132 find that the contents of all of the r stages 124, except the first stage 124A, are non-zero, the combinatorial logic 130 adds the contents of the stage 124A to the received codeword symbol now at location 120A, the "first" location in the window 128. The result is the corrected codeword.

Limitation of Conventional Error Trapping To a Single Error

The problem, of course, is that it cannot be guaranteed that all error patterns will be no more than r symbols long or that no two erroneous symbols in a given received codeword will be more than r codeword locations apart (where r is the length of the encoder shift register). Thus, it cannot be guaranteed that plural errors in any received codeword can be trapped simultaneously in the re-encoder shift register. Accordingly, error trapping guarantees the correction of only a single erroneous symbol in all cases. It is impossible to guarantee correction of two erroneous symbols using conventional error trapping. Accordingly, this type of error trapping may be referred to as "single error trapping".

The problem is how to perform multiple error trapping.

THE INVENTION

Figure 2:
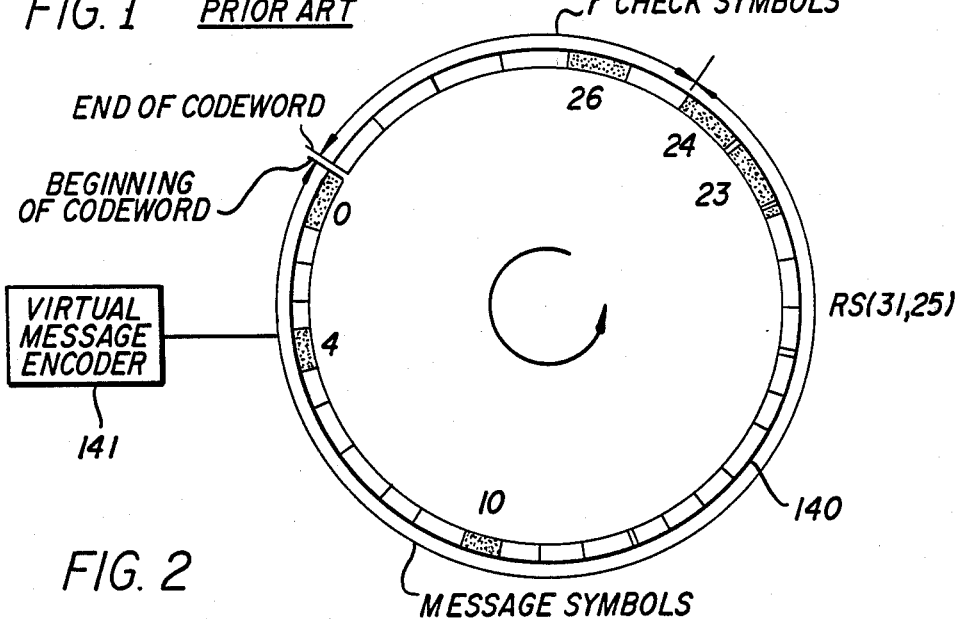
FIG. 2 is a diagram illustrating the principle of the present invention.

Referring to FIG. 2, the received codeword 120 may be stored in a recirculating shift register 140, illustrated in simplistic fashion in FIG. 2 as a circular register. A register 140 contains n cells storing the n symbols of the received codeword 120. The first k of these symbols are the message symbols and the last r of these symbols are the check symbols.

A virtual message Reed-Solomon encoder 141 (which will be described hereinbelow) produces a set of r virtual check symbols by treating the received codeword 120 in such a manner that locations other than the last r check locations in the codeword are treated as virtual check locations while all other locations are treaded as virtual message locations. This, of course, requires that at least some of the r original check locations be treated as virtual message locations. The specification of the virtual check locations to the virtual message encoder may be any pattern of virtual check location in the received codeword. One such pattern is illustrated by the shaded positions of the circular register 140 of FIG. 2. Such a pattern may be defined in terms of a permutation of the original r contiguous check location of the received codeword 120.

One approach is to try all random permutations of r virtual check locations. After a sufficient number of such random permutations of the virtual check locations, and using the method of trial and error, eventually all (but not more than r/2) errors in the received codeword may be simultaneously trapped in the virtual check locations. This embodiment may be unsuitably slow for many applications.

Double Error Trapping

Instead of using trial and error, a systematic approach is taken in the preferred embodiment, in which a selected permutation of the virtual check locations is performed systematically again and again until all of a limited number of error symbols have been trapped in virtual check locations. In the preferred embodiment of the invention, double error trappings (wherein the "limited number" is two) is achieved by using a certain type of permutation of the virtual check locations. Any possible pattern of two erroneous symbols in a given codeword of length n are trapped in a set of r virtual check locations after successive applications of the same permutation. Preferably, this permutation is defined in accordance with the cyclic difference set. The cyclic difference set is described Baumert, L. D., Lecture Notes in Mathematics—Cyclic Difference Sets, Spring-Verlag, 1971.

In the example of FIG. 2, the received codeword 120 stored in the circular register 140 was generated prior to its transmission and reception in accordance with a RS(31,25) code (where r=6). The exemplary permutation of the virtual check locations indicated in shaded positions of the circular shift register 140 in FIG. 2 is defined in accordance with a cyclic difference set in which the original r check locations (i.e., the last six register positions 25–31) are permuted to register positions 0, 4, 10, 23, 24 and 26. These latter locations are the shaded positions in the circular register 140 and are the virtual check locations. By recirculating the 31-symbol codeword 120 through the circular shift register 140, one position at a time, and leaving the register's virtual check locations (positions 0, 4, 10, 23, 24, 26) stationary, any conceivable pattern of two erroneous symbols in the received codeword 120 is eventually trapped simultaneously in two of the r virtual check locations. As soon as this occurs, the non-zero ones of the virtual check symbols computer for the current permutation or "shift" of the virtual check locations are added to those symbols in the received codeword 120 residing in the corresponding virtual check locations.

Preferred Embodiment of the Invention

Figure 3:
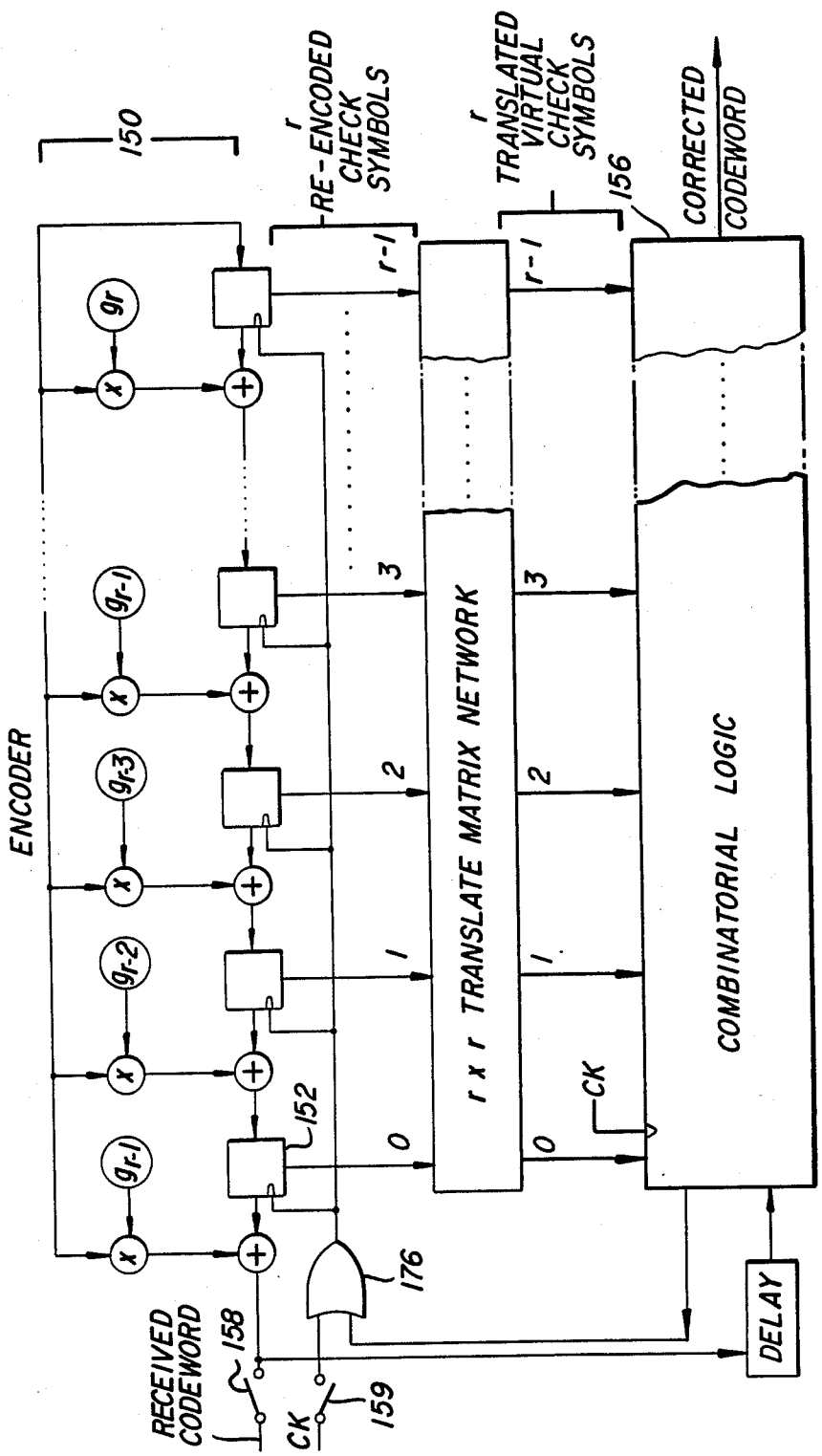
FIG. 3 is a block diagram illustrating the preferred embodiment of the invention.

Referring to FIG. 3, a conventional Reed-Solomon encoder 150 has r stages 152 whose outputs are individually applied to an r×r translate matrix network 154. The translate matrix network 154 transforms any set of r new check symbols contained in the r stages 152 of the encoder 150 into r virtual check symbols in accordance with a certain permutation from the original check locations to a set of virtual check locations. The structure of the matrix network 154 depends solely upon the pattern of virtual check locations. Preferably, this pattern is of the type illustrated in FIG. 2, in which the original check locations for an RS(31,25) code (i.e., codeword locations 26-31) are permuted to the new virtual check locations (i.e., locations 0, 4, 10, 23, 24, 26). The same principle applies to any other similar code—e.g. RS(n,k) codes and their equivalents. The structure of the translate matrix network 154 will be described below.

After the received codeword has been shifted through the encoder 150 (with switches 158, 159 closed), the contents of the encoder 150 are repeatedly recirculated (i.e., shifted with the switches 158, 159 open). The translate matrix network 154 generates a new set of virtual check symbols with each such shift. The translate matrix network 154 transmits each set of r virtual check symbols which it computes to combinatorial logic 156. The combinatorial logic 156 waits until it receives a set of virtual check symbols in which all but no more than a predetermined number (in this example, two) symbols are zero. As soon as this occurs, the combinatorial logic 156 adds the non-zero virtual check symbols to the symbols in the received codeword occupying the corresponding virtual check locations of the current set of virtual check symbols.

In FIG. 2, it will be recalled that all possible permutations of two error symbol locations were achieved by simply rotating the codeword 120 through the circular shift register 140 and maintaining the virtual check location register positions (the shaded register locations in FIG. 2) stationary. This same result is achieved in the embodiment of FIG. 3 by opening the input switches 158 and 159 and then shifting the contents of the encoder 150 through the feedback network illustrated therein. With each shift, a new set of r check symbols is computed and replaces the contents of the r stages 152. Thus, a new r-dimensional vector of check symbols is furnished to the r×r translate matrix network 154, which in turn computes a new set of r virtual check symbols. As long as the number of erroneous symbols does not exceed the predetermined limit (in this example, two), any pattern of errors will be trapped after the encoder 150 has been shifted a sufficient number of times.

Figure 5:
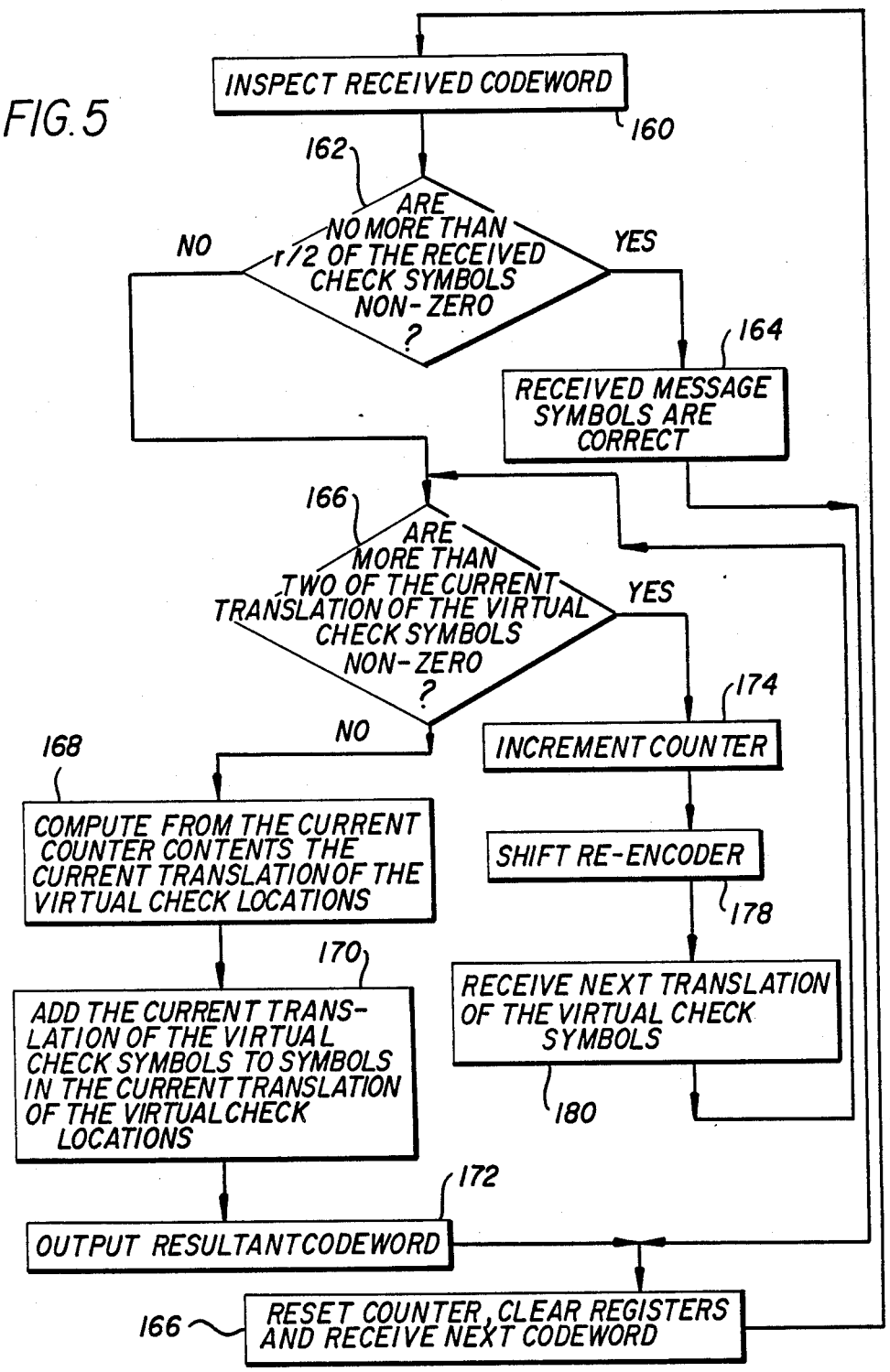
FIG. 5 is a block diagram illustrating the operation of the combinatorial logic in the system of FIG. 3.

Referring to FIG. 5, the combinatorial logic 156 receives the incoming codeword at the same time the codeword is being shifted through the encoder 150. The combinatorial logic 156 inspects the received codeword (step 160 in the algorithm of FIG. 5) and determines whether no more than r/2 of the received check symbols are non-zero. If no more than r/2 of the received check symbols are non-zero, then all of the errors in the received codeword reside within the received check symbols ("yes" branch of step 162), and all of the received message symbols are correct, so that no correction is required (step 164). Thus, the encoder of FIG. 3 in this case performs no error correction and simply passes on the received message symbols to the user as being correct, and then prepares to receive the next codeword (step 166).

If instead the combinatorial logic 156 determines that more than r/2 of the received check symbols are non-zero, then it knows that there are errors in the message symbols ("no" branch of step 162). Therefore, it immediately inspects the r virtual check symbols computed in the matrix network 154 and determines whether more than two of the current virtual check symbols are non-zero (step 166).

If no more than two of the current virtual check symbols are non-zero ("no" branch of step 166), then all of the errors in the received codeword have been trapped in the first permutation of the virtual check locations. In the example of FIG. 2, there may be as many as two erroneous symbols trapped in two of the following codeword locations: 0, 4, 10, 23, 24, 26. Accordingly, no further rotation of the codeword is necessary. Therefore, the combinatorial logic 156 determines (from the permutation pattern) the virtual check locations in terms of original codeword locations (step 168) and then adds the corresponding non-zero virtual check symbols to the original codeword symbols residing in those virtual check locations (step 170). The combinatorial logic 156 then outputs the resultant codeword (step 172) and prepares for receipt of the next codeword (step 166).

If, on the other hand, more than two of the current virtual check symbols were non-zero, ("yes" branch of step 166) then not all errors have been trapped in the current virtual check locations. Accordingly, a further translation of the virtual check locations is required. This corresponds to a rotation of the shift register 140 of FIG. 2 by one position. For this purpose, the combinatorial logic increments a translation counter (step 174) and clocks all of the stages 152 of the encoder 150 through an OR gate 176, so that the contents of the encoder 150 are shifted by one position (step 178). (As mentioned previously, during this time the input switches 158, 159 are open). As a result, the translate matrix network 154 receives a new set of r check symbols and translates them in accordance with the chosen permutation. This produces a new set of r virtual check symbols. This new set of r virtual check symbols corresponds to a second translation of the original check locations and is received by the combinatorial logic 156 (step 180). Immediately, returning to step 166, the combinatorial logic 156 determines whether more than two of the current translation of the virtual check symbols are non-zero, and repeats the process.

After a number of such shifts, and assuming that the number of erroneous symbols does not exceed the predetermined limit (in this example, the limit is two) a point is reached at which step 166 finds that all of the errors have been trapped in virtual check locations. Taking the "no" branch of step 166 at this point, the combinatorial logic 156 must now determine from the current contents of the counter the correlation of the current translation of virtual check locations to original codeword locations (step 168). The combinatorial logic 156 need simply know the permutation pattern of the matrix network 154 (in the preferred embodiment, this pattern is that illustrated in the shaded regions of FIG. 2) and the number of shifts of the encoder 150, which is specified by the contents of the counter.

Once this correlation is obtained, the combinatorial logic 156 simply adds the non-zero ones of the current virtual check symbol to the original codeword symbols residing in corresponding virtual check locations (step 170).

The resulting codeword is then output as the corrected codeword (step 172).

Structure of the Translate Matrix Network (FIG. 4)

As one example of (31,25) RS code over GF(32), the input to the matrix network consists of thirty lines (six 5-bit inputs). The output from the matrix network also consists of thirty lines (six 5-bit outputs). Each output line is the exclusive or of a subset of the thirty input lines. The relevant subsets are determined by the entries of the 6x6 matrix shown in FIG. 4.

In this figure, the original check positions are assumed in this example to be $\alpha^0, \alpha^1, \alpha^2, \alpha^3, \alpha^4, \alpha^5$. The new transformed check locations are $\alpha^0, \alpha^1, \alpha^3, \alpha^8, \alpha^{12}, \alpha^{18}$. This is just a shift of the locations in the example of FIG. 2, namely $\alpha^0, \alpha^4, \alpha^{10}, \alpha^{23}, \alpha^{24}, \alpha^{26}$—i.e., codeword symbol positions 0, 4, 10, 23, 24, 26. The reason for making this shift is to maximize the number of 0's in the matrix.

Working Example

In the following example, the codeword is an RS(31,25) codeword, and the permutation defined by the translate matrix network 154 is that illustrated in FIG. 2. In this example, as a first case, if there were two erroneous symbols in codeword locations 10 and 23, the combinatorial logic 156 would take the "no" branch of step 162 of FIG. 5 and take the "no" branch of step 166 of FIG. 5 while the counter contents is zero. Thus, the two errors would be trapped as soon as the received codeword had been shifted all of the way through the encoder 150 but before the switches 158 and 159 are open and the encoder 150 shifted any further. In this case, the only non-zero virtual check symbols transmitted by the translate matrix network 154 to the combinatorial logic 156 would be the third and fourth virtual check symbols, corresponding to codeword locations 10 and 23. The combinatorial logic 156 would simply add the third and fourth virtual check symbols to the received codeword symbols at codeword locations 10 and 23 respectively to generate the corrected codeword.

As a second case in this same example, if there were two erroneous symbols in the received codeword at codeword locations 9 and 22, then the combinatorial logic 156 would not take the "no" branch of step 166 in FIG. 5 until after the received codeword had been shifted through the encoder 150, incoming switches 158 and 159 had been opened and the contents of the encoder 150 had been shifted once (i.e., by one location). Thus, the contents of the counter would be "one", and (accordingly) the third and fourth virtual check symbols (in the latest permutation or "version" of the virtual check symbols) would be added to codeword locations 9 and 22 to generate the corrected codeword.

Alternative Embodiment

Figure 6:
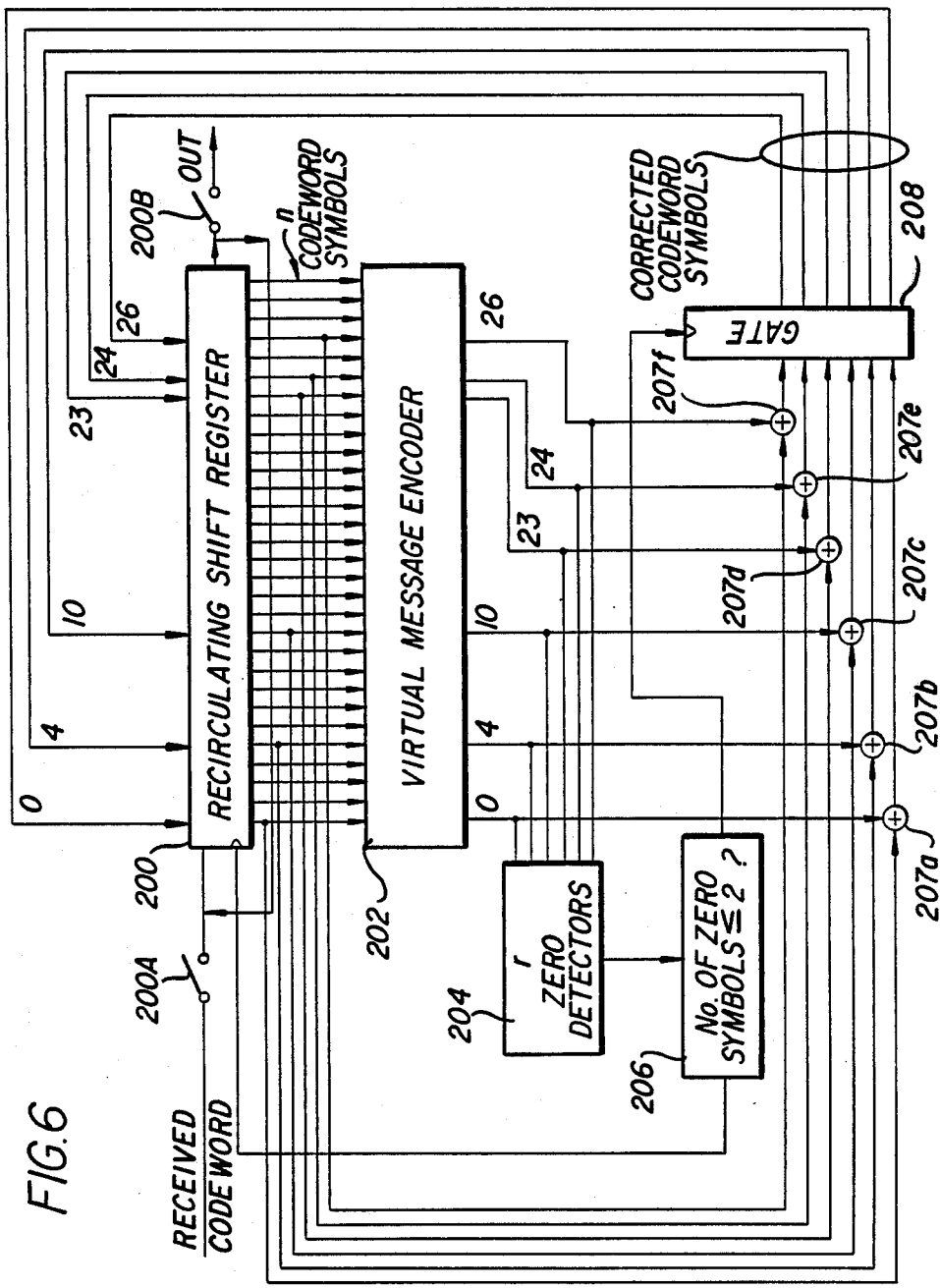
FIG. 6 is a block diagram of an alternative embodiment of the invention.

Referring to FIG. 6, the received codeword may be stored in a recirculating shift register 200 (analogous to the circular shift register 140 of FIG. 2). The contents of the recirculating shift register 200 is read out periodically (i.e., once each shift) to a virtual message encoder 202. Implementation of the virtual message encoder 202 is defined below. In one example, the virtual message encoder 202 encodes using an RS(31,25) code in accordance with the pattern of virtual check locations of FIG. 2 (i.e., the shaded register positions therein). The virtual message encoder 202 thus computes directly from the virtual message locations (the unshaded positions in the register of FIG. 2) r virtual check symbols. These virtual check symbols are inspected by r zero detectors 204. If all but a limited number (e.g., two) of the r virtual check symbols are zero, then all errors in the incoming codeword have been trapped in virtual message locations. The r virtual check symbols (of which, now, no more than a limited number—e.g., two—are non-zero) from the virtual message encoder 202 are added to the r received codeword symbols from the shift register 200 occupying corresponding virtual check locations (e.g., register locations 0, 4, 10, 23, 24, 26), by r Galois field adders 207a–f. This generates r sum symbols, of which no more than a limited number—e.g., two—differ from the corresponding r received codeword symbols. A controller 206, responsive whenever no more than two (in this example) of the r zero detectors 204 are "off", enables a gate 208 to pass the r sum symbols from the r adders 207a–f to the r corresponding locations in the recirculating shift register 200. The r sum symbols replace the r corresponding symbols in the shift register 200. The result is a corrected codeword stored in the shift register 200.

Whenever more than the predetermined number (e.g., two) of the r zero detectors 204 are "off", some of the errors in the received codeword have not been trapped in the latest set of virtual check locations. In such a case, the controller 206 causes the contents of the recirculating shift register 200 to be shifted by one position (corresponding to the rotation of the codeword in the circular shift register of FIG. 2 by one position). This occurs while the input switch 200A is open. With each such shift of the recirculating shift register 200, the virtual message encoder 202 computes a new set of r virtual check symbols. The process is repeated until no more than the predetermined number (e.g., two) of the r zero detectors 204 indicate non-zero virtual check symbols.

Assuming a number of shifts of the recirculating shift register 200 were necessary before trapping all of the errors simultaneously in a set of virtual check locations, and following the addition of the virtual check symbols to the corresponding codeword symbols, the codeword must be "reconstructed" by recirculating the shift register 200 in the opposite direction using the same number of shifts by which it was originally shifted. After this "re-shifting" operation, the output switch 200B may be closed and the contents of the recirculating shift register will be shifted out to the user as the corrected codeword.

The system of FIG. 6 has been illustrated to coincide with the example of FIG. 2, in which the virtual check locations correspond to codeword position 0, 4, 10, 23, 24, 26 for an RS(31,25) codeword. In this example, any pattern of as many as two erroneous symbols will be trapped. Of course, the same principles apply for any equivalent code including, generally, any Reed-Solomon code—RS(n,k).

Virtual Message Encoder

The virtual message encoder 202 is defined in accordance with FIG. 7. The virtual message encoder 202 computes the r virtual check symbols in accordance with the equation given at the bottom of FIG. 7. This computation, as shown, uses all of the virtual message symbols of the received codeword. In FIG. 2, the virtual message locations are all the codeword locations excluding locations 0, 4, 10, 23, 24 and 26. Each codeword location in the definitions of FIG. 7 is designated by an element of the Galois field $GF2^5$. Each element is designated by the term $\alpha^i$, where i ranges between 0 and 30.

The virtual message encoder 202 may be readily implemented by the skilled worker in accordance with FIG. 7 either in the form of dedicated "hard-wired" logic or as a programmed micro-processor.

Multiple Error Trapping

In the preferred embodiment of the invention, only two errors could be trapped, using the set of permutations defined by the cyclic difference set. Using other permutations (such as the complete set of random permutations) to relocate the r virtual check locations, all possible patterns of as many as r/2 erroneous symbols in the received codeword may be trapped in accordance with the invention. Of course, increasing the number of errors to be trapped increases the number of repeated permutations that must (on the average) be attempted, making the decoding process relatively slower.

While the invention has been described in detail by reference to preferred embodiments thereof, variations and modifications may be made without departing from the spirit and scope of the invention.

What is claimed is:

1. An error trapping decoder adapted to decode a received codeword having r redundant check symbols in r predetermined check locations in said received codeword, said error trapping decoder comprising:
   means responsive to specification of a given set of r virtual check locations different from said r check locations, for computing r virtual check symbols corresponding to said given set of r virtual check locations;
   permuting means for specifying to said computing means successive sets of r virtual check locations so that said computing means computes successive sets of r virtual check symbols; and
   means, responsive whenever said permuting means specifies a particular set of r virtual check locations for which the corresponding r virtual check symbols are all zero except for no more than predetermined number, for adding the non-zero ones of said particular set of r virtual check symbols to symbols occupying the corresponding virtual check locations in said received codeword, whereby to generate a corrected codeword.

2. The error trapping decoder of claim 1 wherein said permuting means specifies said successive sets of virtual check locations by successively permuting the locations of the previous set of r virtual check locations in accordance with a predetermined pattern.

3. The error trapping decoder of claim 2 wherein said predetermined pattern corresponds to a cyclic difference set and wherein said predetermined number is two, whereby said error trapping decoder is a double error trapping decoder.

4. The error trapping decoder of claim 3 wherein said codeword is an RS(31,25) codeword and wherein said predetermined pattern of virtual check locations is established by permuting the codeword location $26 \geq 31$ to codeword locations 0, 4, 10, 23, 24, 26.

5. The error trapping decoder of claim 3 wherein said computing means comprises a Reed-Solomon encoder means for generating r remainder symbols from said received codeword and a translation matrix means for transforming said r remainder symbols into r virtual remainder symbols corresponding to said r virtual check locations, and wherein said permuting means comprise means for shifting the contents of said encoder means.

6. The error trapping decoder of claim 3 wherein said computing means comprises a virtual message encoder means for generating said set of r virtual check symbols, said permuting means comprise a circular shift register connected to said virtual message encoding means and said adding means comprise r zero detectors adapted to detect whenever one of said r virtual check symbols is not zero and r Galois field adders each adapted to add one of said virtual check symbols to a corresponding symbol in said received codeword.

7. The error trapping decoder of claim 1 wherein said permuting means specifies said successive sets of virtual check locations in accordance with random permutations thereof.

8. The error trapping decoder of claim 1 wherein said computing means comprises a Reed-Solomon encoder means for generating r remainder symbols from said received codeword and a translation matrix means for transforming said r remainder symbols into r virtual remainder symbols corresponding to said r virtual check locations, and wherein said permuting means comprise means for shifting the contents of said encoder means.

9. The error trapping decoder of claim 1 wherein said computing means comprises a virtual message encoder means for generating said set of r virtual check symbols, said permuting means comprise a circular shift register connected to said virtual message encoding means and said adding means comprise r zero detectors adapted to detect whenever one of said r virtual check symbols is not zero and r Galois field adders each adapted to add one of said virtual check symbols to a corresponding symbol in said received codeword.

10. A method for decoding a received codeword having r redundant check symbols located in r predetermined check locations in said received codeword, said method comprising:
  specifying successive sets of r virtual check locations different from said r predetermined check locations;
  for each set in said successive sets of r virtual check locations, computing r virtual check symbols from appropriate symbols in said received codeword; and
  whenever said computing step generates a set of r virtual check symbols which are all zero except for no more than a predetermined limited number, adding the non-zero ones of said r virtual check symbols to symbols occupying the corresponding virtual check locations in said received codeword, so as to generate a corrected codeword.

11. The method of claim 10 wherein the successive sets of r virtual check locations of said specifying step correspond to rotations of a set pattern of virtual check locations through said received codeword.

12. The method of claim 11 wherein said predetermined pattern of virtual check locations correspond to a cyclic difference set, and wherein said predetermined limited number of non-zero virtual check symbols is two, whereby said method accomplishes double error trapping.

13. A method for decoding a received codeword having r virtual check symbols located in r predetermined check locations in said received codeword, said method comprising:
  generating r remainder symbols from said codeword in accordance with a code generator polynomial;
  transforming said r remainder symbols into r virtual check symbols in accordance with a predetermined set of r virtual check locations;
  shifting the contents of said encoder by one symbol position and then repeating said generating step and said transforming step; and
  determining whenever a givens et of said r virtual check symbols obtained during any one of said above steps has no more than a predetermined limited number of non-zero symbols and adding said non-zero ones of said particular set of r virtual check symbols to symbols in corresponding locations in said received codeword.

14. The method of claim 13 wherein said transforming step transforms said r predetermined check locations to codeword locations corresponding to a cyclic difference set, and wherein said predetermined limited number of non-zero virtual check symbols is two, whereby said method accomplishes double error trapping.

15. A method for decoding a received codeword having r check symbols located in r predetermined check locations, said method comprising:
  shifting a predetermined pattern of virtual check locations through successive translations of said codeword;
  for each of said translations, computing a corresponding set of virtual check symbols; and
  whenever no more than a predetermined limited number of said virtual check symbols are non-zero, adding said non-zero ones of said check symbols to the corresponding symbols in said received codeword so as to generate a corrected codeword.

16. The method of claim 15 wherein said predetermined pattern of virtual check locations corresponds to a cyclic difference set, and wherein said predetermined number of non-zero virtual check symbols is two, whereby said method is a double error trapping decoding method.

* * * * *